United States Patent [19]
Yamamoto

[11] Patent Number: 5,774,027
[45] Date of Patent: Jun. 30, 1998

[54] BAND-PASS FILTER WITH TRAP CIRCUITS HAVING DIFFERENT Q FACTORS

[75] Inventor: Ryuji Yamamoto, Daitou, Japan

[73] Assignee: Sanyo Electric Co., Ltd., Osaka, Japan

[21] Appl. No.: 701,462

[22] Filed: Aug. 22, 1996

[30] Foreign Application Priority Data

Aug. 25, 1995 [JP] Japan ..................................... 7-217789
Aug. 25, 1995 [JP] Japan ..................................... 7-217790

[51] Int. Cl.$^6$ .................................................. H03H 7/01
[52] U.S. Cl. .......................................... 333/167; 333/175
[58] Field of Search ..................................... 333/167, 175, 333/176

[56] References Cited

U.S. PATENT DOCUMENTS

| | | | |
|---|---|---|---|
| 3,271,705 | 9/1966 | Karkar | 333/176 |
| 4,263,619 | 4/1981 | Theriault | 333/176 X |
| 5,256,997 | 10/1993 | Inagaki | 333/167 X |

FOREIGN PATENT DOCUMENTS 2-166817  6/1990  Japan ..................................... 333/176

*Primary Examiner*—Robert Pascal
*Assistant Examiner*—Justin P. Bettendorf
*Attorney, Agent, or Firm*—Armstrong, Westerman, Hattori, McLeland & Naughton

[57] ABSTRACT

A band-pass filter device includes a band-pass filter having a characteristic for sufficiently passing signals belonging to a passing frequency band to be passed, a first trap circuit having a Q factor sufficiently higher than that of the BPF and attenuating signals belonging to a frequency band ranging frequencies higher than the passing frequency band, a second trap circuit for attenuating signals belonging to a frequency band ranging frequencies lower than the passing frequency band, a third trap circuit having a Q factor lower than that of the first trap circuit and attenuating an unnecessary component generated in the first trap circuit from the signal, a fourth trap circuit having a Q factor lower than that of the second trap circuit and attenuating an unnecessary component generated in the second trap circuit from the signal. When a first signal belonging to a passing frequency band and a second signal belonging to a frequency band ranging frequencies lower or higher than the passing frequency band are simultaneously supplied to a BPF device having this structure, the BPF device can selectively pass the first signal, and completely attenuate the unnecessary second signal. A structure comprising two BPF having different central passing frequencies, first and third trap circuits having relatively low Q factors, a second trap circuit having a high Q factor and eliminating an unnecessary component which cannot be removed by the first trap circuit can also realize such a good BPF device as described above.

19 Claims, 11 Drawing Sheets

BAND-PASS FILTER WITH TRAP CIRCUITS HAVING DIFFERENT Q FACTORS

BACKGROUND OF THE INVENTION

1. Field of the Invention

The present invention relates to a band-pass filter (BPF) device for sufficiently passing a signal belonging to a necessary frequency band and completely attenuating a signal belonging to an unnecessary frequency band, particularly to a BPF device whose dynamic range and signal to noise (S/N) ratio are improved.

2. Description of the Prior Art

In 8 mm video tape recorders-(VTRs), a sound signal is frequency-modulated at 1.5 MHz in the left (L) channel and at 1.7 MHz in the right (R) channel in order to perform recording/reproduction. When reproducing a signal, its L and R channels needs to be accurately separated, since after separation the signal is processed into the L and R channels.

The band width of the R and L channels is 0.2 MHz. FIG. 1 shows a BPF device for carrying out the separation (separating the L channel). A first BPF (1) and second BPF (2) have a central passing frequency of 1.5 MHz. A first trap circuit (3) has a central attenuating frequency of about 1.2 MHz. A second trap circuit (4) has a central attenuating frequency of about 1.8 MHz.

Consequently, a total frequency characteristic shown by the solid curve A in FIG. 2 is observed between an input terminal (5) and output terminal (6) in FIG. 1. In FIG. 2, the left and right portions of the curve centered at 1.5 MHz should be balanced due to a group delay characteristic. Therefore, the first trap circuit (3) having a central attenuating frequency is disposed.

This enables separation into the R and L channels using a BPF device as shown in FIG. 1.

However, the BPF device shown in FIG. 1 cannot sufficiently attenuate R channel components. In order to sufficiently attenuate the R channel component, the central attenuating frequency of the second trap circuit (4) (about 1.8 MHz) is lowered to 1.7 MHz. A simple change in the central attenuating frequency to 1.7 MHz adversely causes the left channel component to be lost in part.

The left channel component has a frequency band ranging from 1.4 to 1.6 MHz. Therefore, when changing the central attenuating frequency of the second trap circuit (4) into 1.7 MHz, components near 1.6 MHz are also attenuated. Instead of this, the central attenuating frequency of the second trap circuit (4) remains at 1.8 MHz, and the Q factor [quality factor] of the second trap circuit (4) is increased. However, when increasing the Q factor, components near 1.7 MHz can be attenuated, but the S/N ratio of the second trap circuit (4) is decreased. The device shown in FIG. 1 can be realized by a filter formed in an IC (comprising a mutual conductance and capacitance of a differential amplifier). When the filter is used as the second trap circuit (4), a minimum signal level in the circuit is further decreased with the increase in the Q factor. This causes the L channel component of a signal, which should be accurately extracted, to be hidden by noise generated in the inside of the circuit. In addition, when increasing the Q factor, the dynamic range of the second trap circuit (4) is narrowed.

Therefore, development of a BPF device capable of sufficiently passing a signal belonging to a necessary frequency band and sufficiently attenuating a signal belonging to an unnecessary frequency band neighboring the necessary frequency band has been desired.

SUMMARY OF THE INVENTION

The purpose of the present invention is to provide a band-pass filter (BPF) device for sufficiently passing a signal belonging to a necessary frequency band and sufficiently attenuating a signal belonging to an unnecessary frequency band neighboring the necessary frequency band.

In order to achieve the above purpose, a BPF device provided by the present invention has the following features:

A signal belonging to a predetermined passing frequency band and a signal belonging to a frequency band ranging frequencies lower or higher than the passing frequency band are supplied to the BPF device, and the signal belonging to the passing frequency band is selectively permitted to pass through the BPF device.

A BPF device to which a signal belonging to a predetermined passing frequency band and a signal belonging to a frequency band ranging frequencies lower or higher than the passing frequency band are supplied as an input signal, and which selectively permits the portion of the input signal which belongs to the passing frequency band to pass; comprises a BPF having a characteristic permitting all frequency components in a frequency band, to which a signal to be passed belongs, to sufficiently pass; two trap circuits for attenuating a portion of the input signal, which portion belongs to a frequency band existing near the passing frequency band and ranging frequencies higher and lower than the passing frequency band; and one or more trap circuits for attenuating a signal which belongs to the frequency band ranging frequencies higher or lower than the passing frequency band, and cannot be attenuated by at least one of the two trap circuits.

The BPF device includes a band-pass filter having a passing frequency band which covers the frequencies of signals to be passed, and sufficiently passing the signals, a first trap circuit having a quality factor (Q factor) sufficiently higher than that of the BPF and used for attenuating signals belonging to a frequency band ranging frequencies higher than the passing frequency band, a second trap circuit for attenuating signals belonging to a frequency band ranging frequencies lower than the passing frequency band, a third trap circuit, and a fourth trap circuit. The third trap circuit has a Q factor lower than that of the first trap circuit, and attenuates an unnecessary component generated in the first trap circuit from the signal. The fourth trap circuit has a Q factor lower than that of the second trap circuit and attenuates an unnecessary component generated in the second trap circuit from the signal.

A BPF having a relatively low Q factor (representing the sharpness of attenuation) first passes signals which should be passed at all their frequencies. The first and second trap circuits having sufficiently high Q factors surely attenuate an unnecessary component of the signal in a boundary region of the passing frequency band. Furthermore, the third and fourth trap circuits having lower Q factors eliminate an unnecessary component generated by increasing the Q factors of the first and second trap circuits. Therefore, a BPF device provided by the present invention can pass with certainty only the signals belonging to its passing frequency band, even when signals belonging to the passing frequency band and to a neighboring frequency band ranging frequencies out of the passing frequency band, are simultaneously supplied.

In addition, when an amplifier is connected to the output terminals of a first trap section having the first and second trap circuits, a sufficiently wide dynamic range can be totally realized for the BPF device.

In another aspect of the present invention, a BPF device includes a first BPF having its central passing frequency at a higher frequency within the passing frequency band and a second BPF having its central passing frequency at a lower frequency within the passing frequency band. The BPF device further includes a first trap circuit for attenuating signals having frequencies lower or higher than the passing frequency band, a second trap circuit having a Q factor higher than that of the first trap circuit and used for attenuating an unnecessary component of the signal which cannot be eliminated by the first trap circuit, and a third trap circuit for attenuating signals having frequencies lower or higher than the passing frequency band, which are not attenuated by the first trap circuit.

The first and second BPF extract signals belonging to the passing frequency band. The first and third trap circuits eliminate unnecessary signals belonging to a boundary region neighboring the passing frequency band. The Q factor of the first trap circuit is set at a relatively low value. The second trap circuit having a sufficiently high Q factor eliminates an unnecessary component, which cannot be eliminated by the first trap circuit from the signal. A BPF device according to this aspect of the present invention can also surely pass only the signals belonging to its passing frequency band, even when signals belonging to the passing frequency band and to a neighboring frequency band ranging frequencies out of the passing frequency band, are simultaneously supplied.

DESCRIPTION OF THE PREFERRED EMBODIMENT

Embodiment 1

Figure 3:
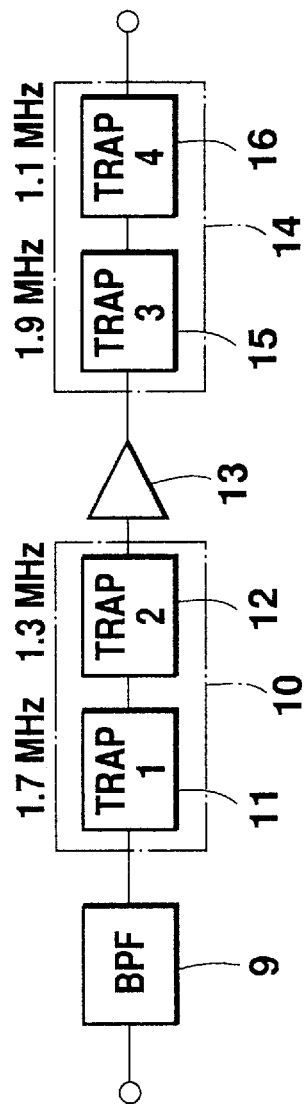
FIG. 3 shows the structure of a BPF device according to the first embodiment of the present invention.

FIG. 3 shows a BPF device according to the first embodiment of the present invention. The BPF device includes a band-pass filter (BPF) (9) to which a frequency-modulated signal with a band width of 0.2 MHz centered at 1.5 MHz and another frequency-modulated signal with a band width of 0.2 MHz centered at 1.7 MHz are supplied, and which sufficiently passes all signals belonging to the frequency band centered at 1.5 MHz, a first trap section (10) to which a signal is supplied from the BPF (9), and which has a first trap circuit [TRAP1] (11) having a quality (Q) factor (representing the sharpness of attenuation) sufficiently higher than that of the BPF (9) and used for attenuating a component of the signal at 1.7 MHz, and a second trap circuit [TRAP2] (12) having a quality (Q) factor sufficiently higher than that of the BPF (9) and used for attenuating a component of the signal at 1.3 MHz. An amplifier (13) for adjusting dynamic range, to which an output signal from the first trap section (10) is supplied, and a second trap section (14) to which a signal is supplied from the amplifier (13), and which has a third trap circuit [TRAP3] (15) having a Q factor lower than that of the first trap circuit [TRAP1] (11) and used for attenuating an unnecessary component, generated by the first trap circuit [TRAP1] (11) from the signal at 1.9 MHz, and a fourth trap circuit [TRAP4] (16) having a Q factor lower than that of the second trap circuit [TRAP2] (12) and used for attenuating an unnecessary component, generated by the second trap circuit [TRAP2] (12) from the signal at 1.1 MHz, are included.

The BPF (9) passes all components of a signal belonging to the frequency band centered at 1.5 MHz (ranging from 1.4 to 1.6 MHz), and attenuates components belonging to a frequency band other than the frequency band centered at 1.5 MHz. Therefore, when the Q factor of this BPF (9) is increased, the frequency selectivity can be improved, but components of the signal near 1.4 and 1.6 MHz are lost. The Q factor of the BPF (9) is set at a relatively low value leading to a characteristic shown by the solid curve a in FIG. 4.

Figure 4:
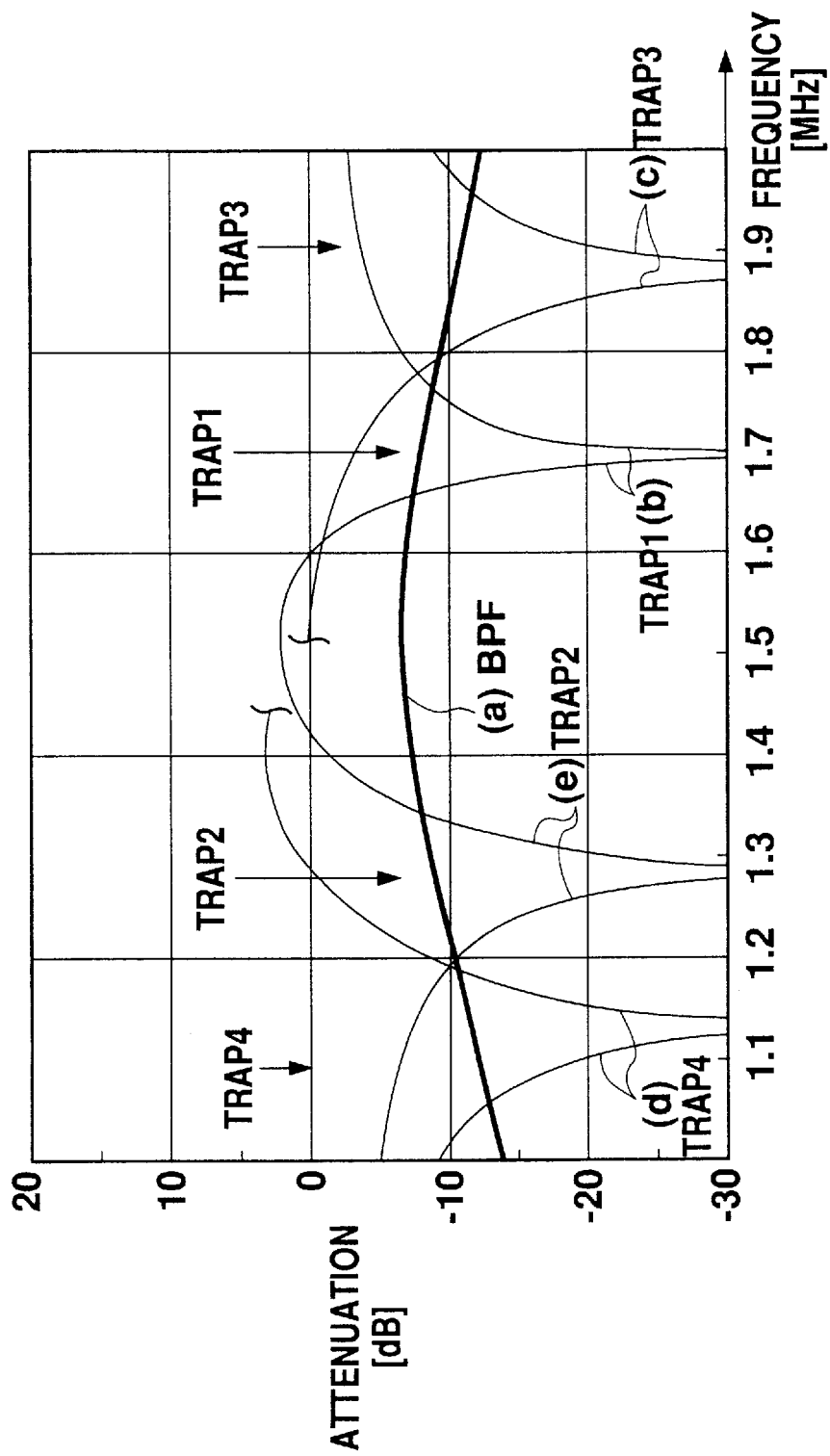
FIG. 4 represents characteristics of a BPF device according to the first embodiment of the present invention.

The first trap section (10) has a series connection of the first trap circuit [TRAP1] (11) and second trap circuit [TRAP2] (12). The sequence of the two circuits in the series connection may be reversed. The solid curve b in FIG. 4 shows a frequency characteristic of the first trap circuit [TRAP 1] (11). The central attenuation frequency of the first trap circuit [TRAP1] (11) is set at 1.7 MHz. The Q factor of the first trap circuit [TRAP1] (11) is set at a value higher than those of the BPF (9) and third trap circuit [TRAP3] (15) shown in FIG. 3. This enables the component at 1.7 MHz to be sufficiently attenuated, as well as prevents the component at 1.6 MHz from being lost.

Figure 5:
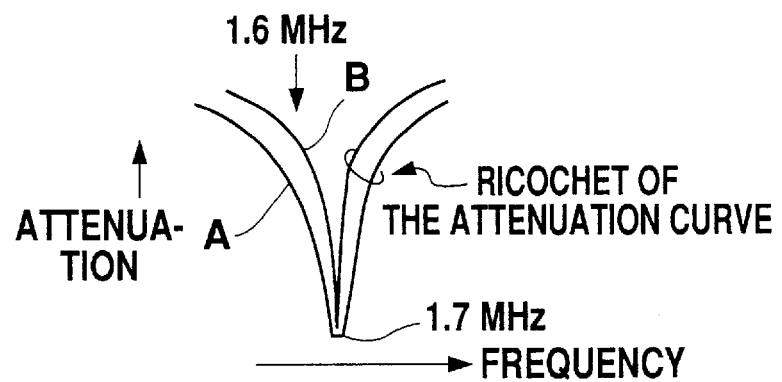
FIG. 5 represents characteristics of a trap circuit according to the first embodiment of the present invention.

The characteristic of this first trap circuit [TRAP1] (11) will be described by reference to FIG. 5. FIG. 5 shows a relationship between the attenuation and frequency in the first trap circuit [TRAP1] (11). The solid curve A and B in FIG. 5 represent the attenuation characteristics (specially, the characteristics called a "ricochet" of the attenuation curves when the Q factor of the first trap circuit [TRAP1] (11) is low and high). The characteristic of the first trap circuit [TRAP1] (11) shown by the solid curve A results in attenuation of the signal at 1.7 MHz, as well as at 1.6 MHz. Therefore, in the first embodiment of the present invention, the Q factor of the first trap circuit [TRAP1] (11) is set at a high value, realizing a characteristic shown by the solid curve B in FIG. 5. The heightened Q factor causes the shoulder of the curve representing the filter characteristic to be raised, leading to a decreased attenuation of the signal at 1.6 MHz.

However, as shown in FIG. 5, the heightened Q factor brings about a raised shoulder of the filter characteristic curve at higher frequencies. In other words, the ricochet of the attenuation curve is raised since the Q factor of the first trap circuit [TRAP1] (11) is high. This ricochet (raised shoulder) generates an unnecessary component of the signal at frequencies higher than 1.7 MHz. Therefore, in the present invention, the third trap circuit [TRAP3] (15) having a low Q factor is disposed in order to remove the unnecessary component generated from the ricochet of the attenuation curve B.

This combination of the first trap circuit [TRAP1] (11) and third trap circuit [TRAP3] (15) enables filter characteristics for passing all components belonging to the frequency band centered at 1.5 MHz (ranging from 1.4 to 1.6 MHz), and attenuating signals belonging to the frequency band centered at 1.7 MHz. The curves representing attenuation from 1.5 MHz toward the left and right in FIG. 4 need to be balanced due to a group delay characteristic. Therefore, the second trap circuit [TRAP2] (12) having a central attenuation frequency of about 1.3 MHz is disposed. The Q factor of the second trap circuit [TRAP2] (12) is set at such a value sufficiently higher than that of the BPF (9), as that of the first trap circuit [TRAP1] (11). In the second trap circuit [TRAP2] (12), an unnecessary component is also generated by a ricochet of the attenuation curve at frequencies lower than 1.3 MHz. The fourth trap circuit [TRAP4] (16) is disposed in order to remove the effect of the ricochet of the curve.

Figure 2:
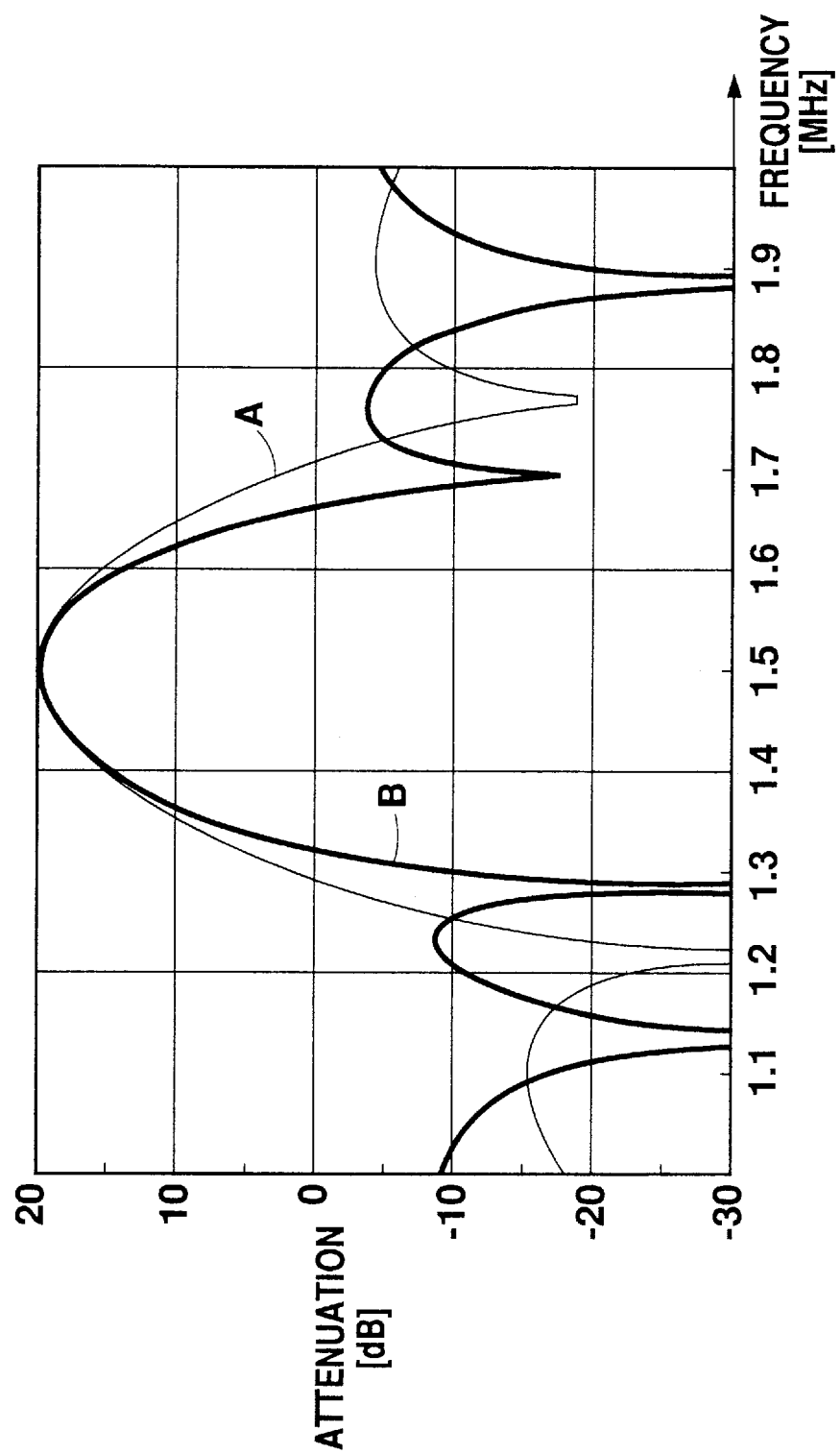
FIG. 2 represents characteristics of BPF devices according to the prior art and to the first embodiment of the present invention.

The solid curve (c) in FIG. 4 shows a characteristic of the third trap circuit [TRAP3] (15), and the solid curve (d) in FIG. 4 shows that of the fourth trap circuit [TRAP4] (16). Consequently, the total filter characteristic of the device shown in FIG. 3 becomes such as shown by the solid curve B in FIG. 2, enabling good filter characteristics for passing all components belonging to the frequency band centered at 1.5 MHz, and attenuating signals belonging to the frequency band centered at 1.7 MHz.

Figure 6:
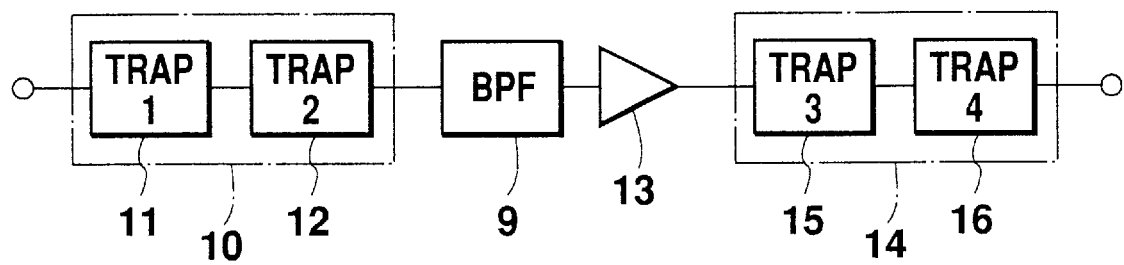
FIG. 6 shows a block diagram representing the structure of a BPF device according to the first embodiment of the present invention, which is different from that shown in FIG. 3.

The BPF (9) shown in FIG. 3 may be disposed after the first trap section (10). FIG. 6 exemplifies a device having the BPF (9) disposed after the first trap section (10). As shown in FIG. 6, the BPF having a low Q factor is disposed after the first trap section (10) having a high Q factor and relatively narrow dynamic range. This structure enables a signal to pass through this BPF device with a high signal level, and makes this BPF device noise-resistant. The Q factors of the first and second trap circuits [TRAP1] and [TRAP2] (11) and (12) in the first trap section (10) are set at high values, leading to a narrow dynamic range of the circuits. Therefore, in the first embodiment, the first trap section (10) is disposed before the second trap section (14), and the amplifier (13) is connected to the output terminal of the first trap section (10) or of the BPF (9) (as shown in FIG. 6). When the dynamic range of the BPF device is sufficiently wide, the amplifier (13) can be disposed further before. Since the Q factor of the second trap section (14) is low, the amplifier (13) may be disposed at the last stage.

Figure 1:
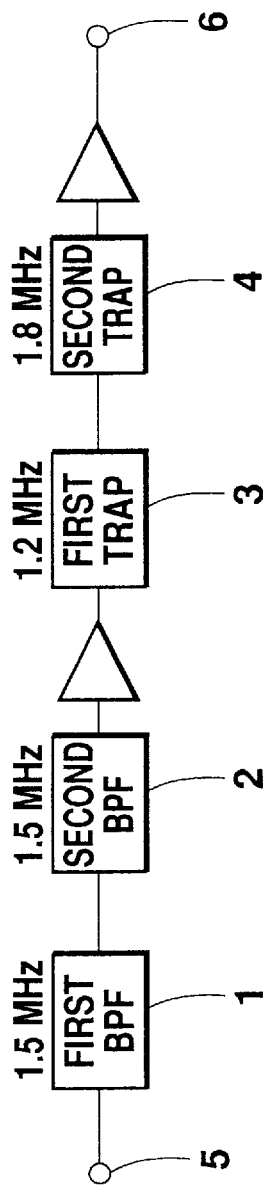
FIG. 1 shows a block diagram representing the structure of a conventional BPF device.
Figure 7:
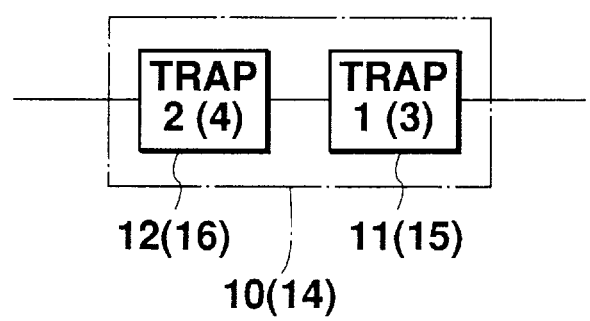
FIG. 7 shows a block diagram representing the structure of another example of the first or second trap section according to the first embodiment of the present invention.

The BPF device shown in FIG. 1 can accurately separate the R and L channel from each other. In the first embodiment, the first trap section (10) has a series connection of the first trap circuit [TRAP1] (11) and second trap circuit [TRAP2] (12), and the second trap section (14) has a series connection of the third trap circuit [TRAP3] (15) and fourth trap circuit [TRAP4] (16). The sequence of the trap circuits in the series connections is not limited to that shown in FIG. 3 or FIG. 6. As shown in FIG. 7, the sequence of the trap circuits may be reversed. The sequence of the trap circuits may be reversed in any of the first trap section (10) or second trap section (14), as shown in FIG. 7.

As shown in this first embodiment, a BPF characteristic derived from a low Q factor is centrally used, and a trap characteristic derived from a high Q factor added to BPF characteristic in neighboring higher and lower frequency regions. A trap characteristic derived from a low Q factor is further added in further high and low frequency regions than the neighboring frequency regions. This realizes a BPF device for sufficiently passing a signal belonging to a necessary frequency band, and sufficiently attenuating a signal belonging to a neighboring unnecessary frequency band at the same time.

In addition, a structure according to the first embodiment realizes a BPF filter device particularly having an improved filter characteristic near 1.7 MHz. When such a device as an automatic gain controller (AGC) is connected before the BPF device, and then the input level and changing range of a signal are small, the performance of the BPF device is further improved.

Embodiment 2

Figure 8:
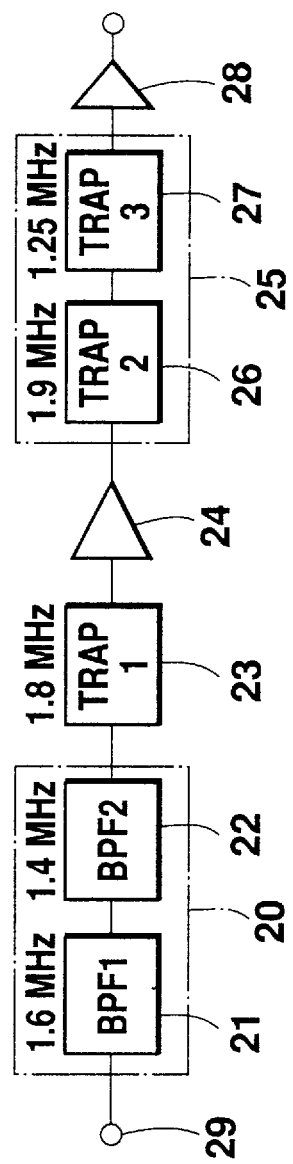
FIG. 8 shows a block diagram of a BPF device according to the second embodiment of the present invention.

FIG. 8 shows a BPF device according to the second embodiment of the present invention. The BPF device includes an input terminal (29) to which a frequency-modulated signal with a band width of 0.2 MHz centered at 1.5 MHz and another frequency-modulated signal with a band width of 0.2 MHz centered at 1.7 MHz are supplied, a BPF section (20) having a series connection of a first BPF [BPF1] (21) having a central passing frequency of 1.6 MHz and a second BPF [BPF2] (22) having a central passing frequency of 1.4 MHz, a first trap circuit [TRAP1] (23) to which an output signal of the BPF section (20) is supplied, and whose central attenuation frequency is set at 1.8 MHz to attenuate a signal at 1.7 MHz, an amplifier (24), a trap section (25) having a series connection of a second trap circuit [TRAP2] (26) to which an output signal of the first trap circuit [TRAP1] (23), whose Q factor is set at a value higher than that of the first trap circuit [TRAP1] (23), and which has a central attenuation frequency of 1.9 MHz in order to attenuate an unnecessary component generated by the first trap circuit [TRAP1] (23) and a third trap circuit [TRAP3] (27) having a central attenuation frequency of 1.25 MHz, and an amplifier (28).

Figure 9:
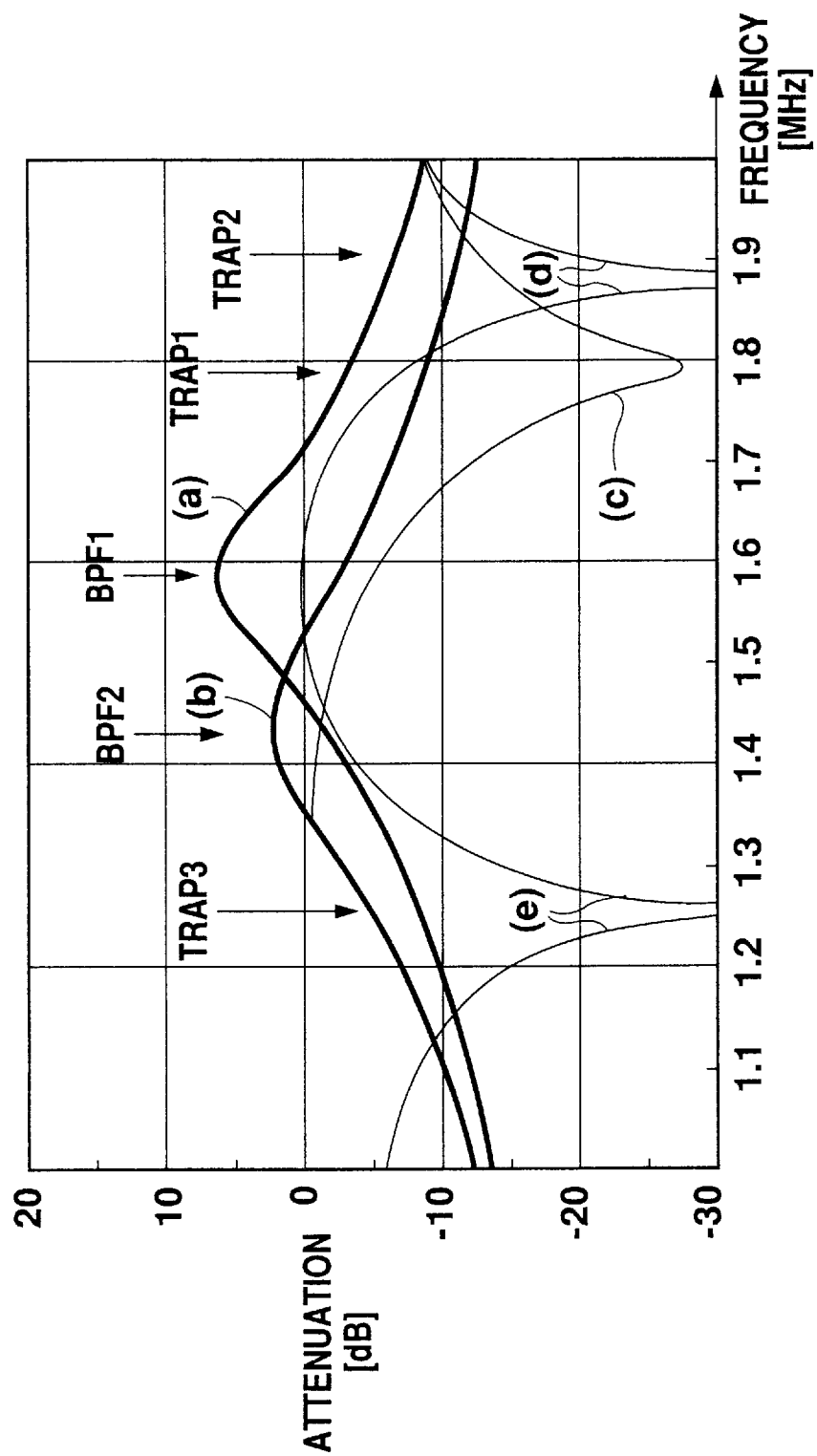
FIG. 9 represents characteristics of a BPF device according to the second embodiment of the present invention.

The solid curves (a) to (e) show frequency characteristics of the first BPF [BPF1] (21), second BPF [BPF2] (22), first trap circuit [TRAP1] (23), second trap circuit [TRAP2] (26) and third trap circuit [TRAP3] (27), respectively. The central attenuation frequency of the first trap circuit [TRAP1] (23) (nominally 1.8 MHz) is precisely 1.78 MHz. The central attenuation frequency of the second trap circuit [TRAP2] (26) (nominally 1.9 MHz) is precisely 1.88 MHz. The BPF section (20) is a filter for passing all components belonging to the frequency band centered at 1.5 MHz (ranging from 1.4 to 1.6 MHz), and attenuating signals belonging to the other frequency bands. The BPF section (20) includes two BPFs (21) and (22) having different central passing frequencies in order to uniformly pass all the components. As shown in FIG. 9, the attenuation of the first BPF [BPF1] (21) (shown by the solid curve (a)) is made higher at frequencies below 1.5 MHz than that of the second BPF [BPF2] (22) (shown by the solid curve (b)). The total attenuation can be improved to a relatively large value. This enables this BPF device to solely have the third trap circuit [TRAP3] (27) for a region ranging frequencies lower than 1.5 MHz. Simultaneously, the attenuation at 1.6 MHz is not made very large.

Figure 12:
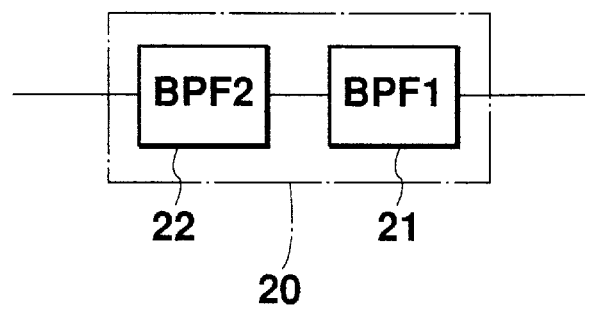
FIG. 12 shows a block diagram representing the structure of another example of the BPF section according to the second embodiment of the present invention.

The BPF section (20) has a series connection of the first BPF [BPF1] (21) and second BPF [BPF2] (22). The sequence of the two BPFs in the series connection may be reversed (see FIG. 12). The central attenuation frequency of the first trap circuit [TRAP1] (23) is set at about 1.8 MHz, and the Q factor of the first trap circuit [TRAP1] (23) is set at a value lower than usual. This can prevent a minimum level of a signal in the circuit from being hidden in noise, enabling a good S/N ratio and a wide dynamic range circuit, even when the circuit is formed in an IC.

The first trap circuit [TRAP1] (23) has such an attenuation characteristic as shown by the solid curve (c) in FIG. 9, which shows a "ricochet" of the attenuation curve in a frequency band about 1.9 MHz. This ricochet generates adversely affecting frequency components at frequencies higher than 1.8 MHz. Therefore, in the second embodiment, the second trap circuit [TRAP2] (26) is disposed in order to selectively eliminate an unnecessary component generated by the ricochet of the attenuation curve by setting its Q factor at a value higher than that of the first trap circuit [TRAP1] (23). When the Q factor of the first trap circuit [TRAP1] (23) is low, the attenuation at 1.7 MHz becomes smaller, but a component at 1.6 MHz is passed well. The second trap circuit [TRAP2] (26) compensates the decreased attenuation at 1.7 MHz.

This combination of the first and second trap circuits [TRAP1] and [TRAP2] (23) and (26) realizes such filter characteristics as components belonging to a frequency band centered at 1.6 MHz are passed, and signals belonging to a frequency band centered at 1.7 MHz are attenuated. The curves formed from 1.5 MHz toward the left and right in FIG. 9 need to be balanced due to a group delay characteristic. Therefore, the third trap circuit [TRAP3] (27) having a central attenuation frequency of about 1.25 MHz is disposed. The characteristic of the third trap circuit [TRAP3] (27) is determined from the balance of the curves.

Figure 10:
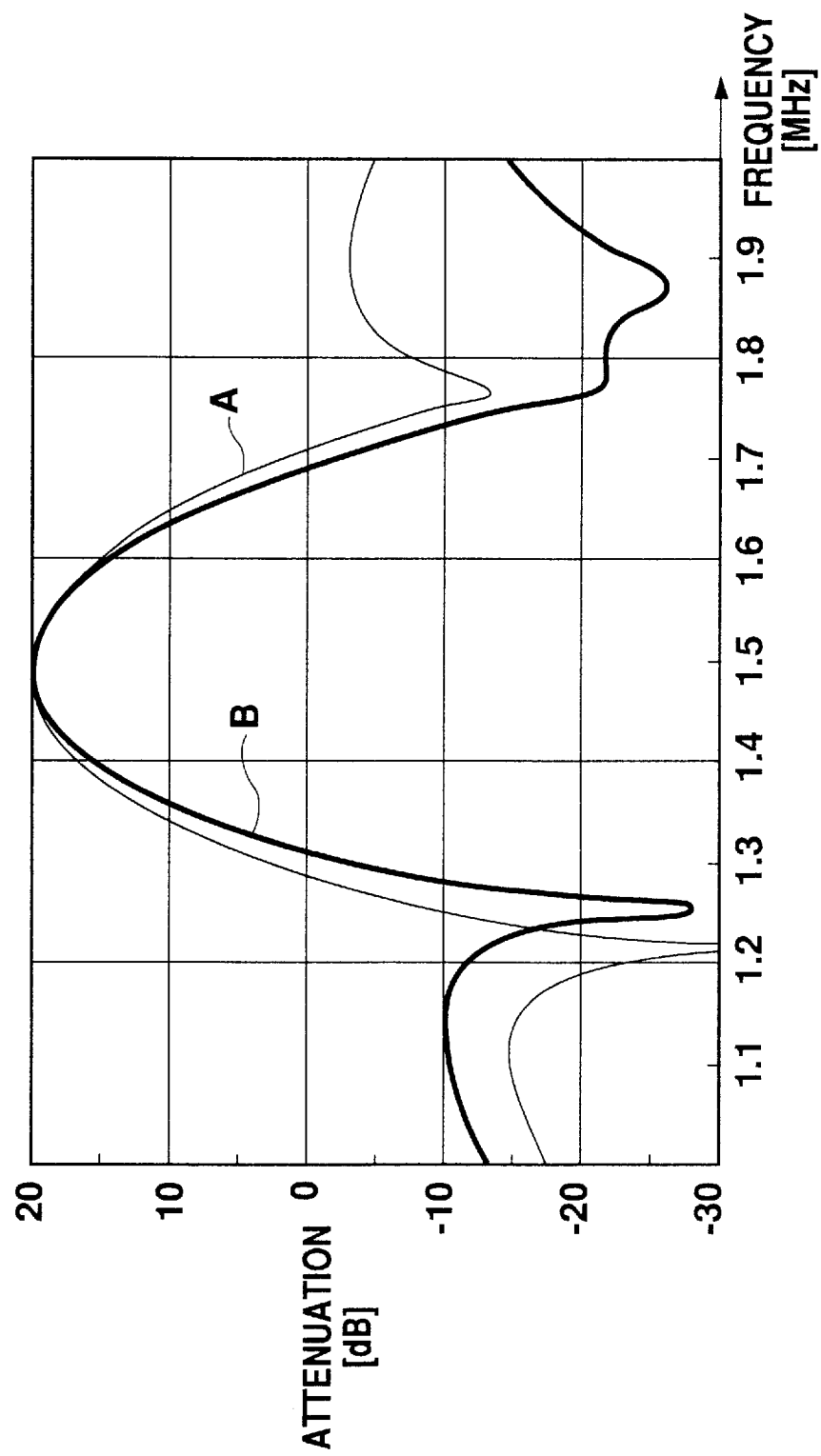
FIG. 10 represents characteristics of BPF devices according to the prior art and to the second embodiment of the present invention.

Consequently, the total filter characteristic of the structure shown in FIG. 8 becomes such as shown by the solid curve B in FIG. 10, realizing that all components belonging to a frequency band centered at 1.5 MHz are passed, and signals belonging to a frequency band centered at 1.7 MHz are attenuated. The solid curve A in FIG. 10 is a filter characteristic of a conventional BPF device, and shown for comparing it with that of a BPF device according to this embodiment. Therefore, the L and R channels can be accurately separated in the BPF device of this embodiment shown in FIG. 8. The structure according to the second embodiment enables a BPF device having a sufficiently wide dynamic range.

Figure 13:
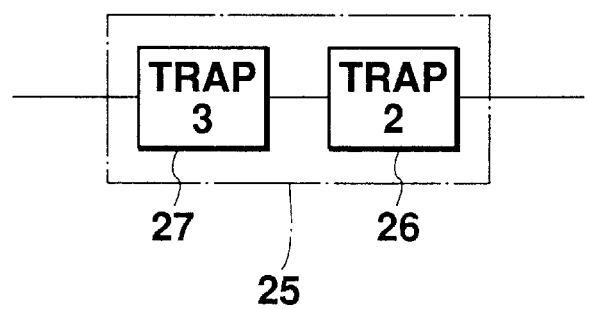
FIG. 13 shows a block diagram representing the structure of another example of the trap section according to the second embodiment of the present invention.

The trap section (25) has a series connection of the second trap circuit [TRAP2] (26) and third trap circuit [TRAP3] (27). The sequence of the two circuits in the series connection may be reversed (FIG. 13).

Figure 11:
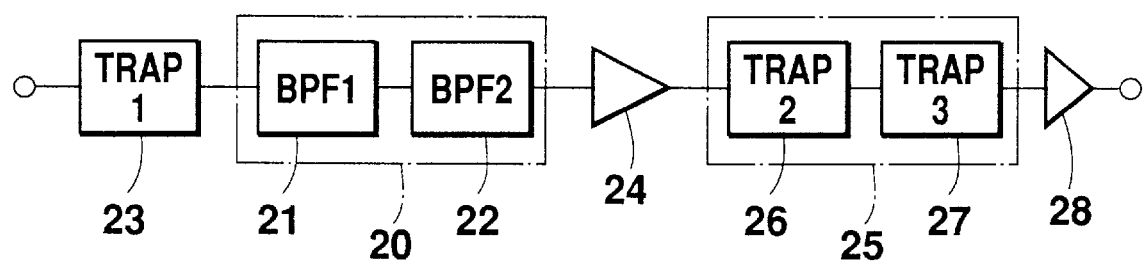
FIG. 11 shows a block diagram representing the structure of a BPF device according to the second embodiment of the present invention, which is different from that shown in FIG. 8.

The first trap circuit [TRAP1] (23) in FIG. 8 may be connected before the BPF section (20). An example of this structure is shown in FIG. 11. As shown in FIG. 11, the first trap circuit [TRAP1] (23) having a high Q factor and narrow dynamic range is disposed before the BPF section (20). This structure enables a signal to pass through the BPF device with a high signal level, and makes the BPF device noise-resistant. The amplifier (24) is connected after the BPF section (20) because the dynamic range of the BPF section (20) is small. The amplifier (24) amplifies an output signal from the first trap circuit [TRAP1] (23) shown in FIG. 8, or from the BPF section (20) shown in FIG. 11, and supplies it to the second trap section (25). The amplifier (28) is disposed to adjust the total dynamic range of this BPF device. When the dynamic range of the BPF device is sufficiently wide, the amplifier (24) can be disposed further before, making the BPF device more noise-resistant.

In FIG. 8, the elimination of an unnecessary component at 1.7 MHz has been described. The second embodiment can also be applied to the elimination of an unnecessary component at a lower frequency, such as 1.3 MHz.

In the second embodiment, two BPF characteristics having different central attenuation frequencies are mainly used, and a trap characteristic is derived from a low Q factor added to the BPF characteristic in a neighboring higher frequency region (i.e. unnecessary frequency region). A trap characteristic derived from a high Q factor is further added in a further high frequency region than the neighboring frequency region. This realizes a BPF device for sufficiently passing a signal belonging to a necessary frequency band, and sufficiently attenuating a signal belonging to a neighboring unnecessary frequency band at the same time.

While there has been described what are at present considered to be preferred embodiments of the present invention, it will be understood that various modifications may be made thereto, and it is intended that the appended claims cover all such modifications as fall within the true spirit and scope of the present invention.

What is claimed is:

1. A band-pass filter device to which a signal belonging to a predetermined passing frequency band and a signal belonging to a frequency band other than the passing frequency band are supplied as an input signal, and which selectively permits a portion of the input signal which belongs to the passing frequency band to pass, comprising:

a BPF having a characteristic permitting all frequency components in a frequency band, to which a signal to be passed belongs, to sufficiently pass;

a first trap circuit having a Q factor sufficiently higher than that of the BPF, and used for attenuating a signal belonging to a frequency band higher than the passing frequency band;

a second trap circuit having a Q factor sufficiently higher than that of the BPF, and used for attenuating a signal belonging to a frequency band lower than the passing frequency band;

a third trap circuit having a Q factor lower than that of the first trap circuit, and used for attenuating an unnecessary component generated in the first trap circuit; and a fourth trap circuit having a Q factor lower than that of the second trap circuit, and used for attenuating an unnecessary component generated in the second trap circuit.

2. A BPF device in accordance with claim 1, further comprising:

a first trap section including the first trap circuit and the second trap circuit; and a second trap section including the third trap circuit and the fourth trap circuit; wherein the signal belonging to the passing frequency band and the signal belonging to a frequency band other than the passing frequency band are supplied as the input signal to the BPF, a signal which has passed through the BPF is supplied to the first trap section, and a signal which has passed through the first trap section is supplied to the second trap section.

3. A BPF device in accordance with claim 2, wherein the first trap circuit and the second trap circuit are connected in series in the first trap section, and the third trap circuit and the fourth trap circuit are connected in series in the second trap section.

4. A BPF device in accordance with claim 2, further comprising:
an amplifier for amplifying a signal which has passed through the first trap section, and then supplying the signal to the second trap section.

5. A BPF device in accordance with claim 1, further comprising:
a first trap section including the first trap circuit and the second trap circuit; and
a second trap section including the third trap circuit and the fourth trap circuit, wherein the signal belonging to the passing frequency band and the signal belonging to a frequency band other than the passing frequency band are supplied as the input signal to the first trap section, a signal which has passed through the first trap section is supplied to the BPF, and a signal which has passed through the BPF is supplied to the second trap section.

6. A BPF device in accordance with claim 5, wherein the first trap circuit and the second trap circuit are connected in series in the first trap section, and the third trap circuit and the fourth trap circuit are connected in series in the second trap section.

7. A BPF device in accordance with claim 5, further comprising:
an amplifier for amplifying a signal which has passed through the BPF, and then supplying the signal to the second trap section.

8. A BPF device in accordance with claim 1, wherein a first signal belonging to a predetermined passing frequency band and a second signal belonging to a frequency band other than the passing frequency band are supplied as the input signal, the frequency band to which the first signal belongs is a band centered at 1.5 MHz, and the frequency band to which the second signal belongs is a band centered at 1.7 MHz.

9. A BPF device in accordance with claim 8, wherein the central attenuation frequency of the first trap circuit is about 1.7 MHz, the central attenuation frequency of the second trap circuit is about 1.3 MHz, the central attenuation frequency of the third trap circuit is about 1.9 MHz, and the central attenuation frequency of the fourth trap circuit is about 1.1 MHz.

10. A BPF device to which a signal belonging to a predetermined passing frequency band and a signal belonging to a frequency band other than the passing frequency band are supplied as an input signal, and which selectively permits a portion of the input signal, which portion belongs to the passing frequency band, to pass, comprising:
a first BPF whose central passing frequency is set at a higher frequency within the passing frequency band;
a second BPF whose central passing frequency is set at a lower frequency within the passing frequency band;
a first trap circuit for attenuating a signal belonging to a frequency band other than the passing frequency band,
a second trap circuit having a Q factor higher than that of the first trap circuit, and used for attenuating an unnecessary signal which cannot be eliminated by the first trap circuit; and
a third trap circuit for attenuating a signal which belongs to the frequency band other than the passing frequency band, and is not attenuated by the first trap circuit.

11. A BPF device in accordance with claim 10, further comprising:
a BPF section in which the first BPF and the second BPF are connected in series; and
a trap section in which the second trap circuit and the third trap circuit are connected in series.

12. A BPF device in accordance with claim 11, wherein the signal belonging to the passing frequency band and the signal belonging to a frequency band other than the passing frequency band are supplied to the BPF section, a signal which has passed through the BPF section is supplied to the first trap circuit, and a signal which has passed through the first trap circuit is supplied to the trap section.

13. A BPF device in accordance with claim 12, further comprising:
an amplifier for amplifying a signal which has passed through the first trap circuit, and then supplying the signal to the trap section.

14. A BPF device in accordance with claim 11, wherein the signal belonging to the passing frequency band and the signal belonging to a frequency band other than the passing frequency band are supplied to the first trap circuit, a signal which has passed through the first trap circuit is supplied to the BPF section, and a signal which has passed through the BPF section is supplied to the trap section.

15. A BPF device in accordance with claim 14, further comprising an amplifier for amplifying a signal which has passed through the BPF section, and then supplying the signal to the trap section.

16. A BPF device in accordance with claim 10, wherein a first signal belonging to a predetermined passing frequency band and a second signal belonging to a frequency band other than the passing frequency band are supplied as the input signal, the frequency band to which the first signal belongs is a band centered at 1.5 MHz, and the frequency band to which the second signal belongs is a band centered at 1.7 MHz.

17. A BPF device in accordance with claim 16, wherein the central passing frequency of the first BPF is about 1.6 MHz, and the central passing frequency of the second BPF is about 1.4 MHz.

18. A BPF device in accordance with claim 17, wherein the central attenuation frequency of the first trap circuit is about 1.8 MHz, the central attenuation frequency of the second trap circuit is about 1.9 MHz, and the central attenuation frequency of the third trap circuit is about 1.25 MHz.

19. A BPF device in accordance with claim 11, wherein the attenuation at the central passing frequency of the first BPF and that at the central passing frequency of the first BPF have values different from each other.

* * * * *